United States Patent

Hillman et al.

[11] Patent Number: 5,975,912
[45] Date of Patent: Nov. 2, 1999

[54] LOW TEMPERATURE PLASMA-ENHANCED FORMATION OF INTEGRATED CIRCUITS

[75] Inventors: Joseph T. Hillman, Scottsdale; Robert F. Foster, Phoenix, both of Ariz.

[73] Assignees: Materials Research Corporation, Gilbert, Ariz.; Sony Corp., Tokyo, Japan

[21] Appl. No.: 08/253,978

[22] Filed: Jun. 3, 1994

[51] Int. Cl.$^6$ .................................................. H01L 21/465
[52] U.S. Cl. ........................ 437/245; 437/192; 437/225
[58] Field of Search ................................ 437/192, 246, 437/225, 245

[56] References Cited

U.S. PATENT DOCUMENTS

| | | |
|---|---|---|
| 3,656,995 | 4/1972 | Reedy, Jr. ................................ 117/69 |
| 4,138,306 | 2/1979 | Niwa . |
| 4,151,325 | 4/1979 | Welch . |
| 4,178,877 | 12/1979 | Kudo . |
| 4,282,267 | 8/1981 | Kuyel . |
| 4,352,834 | 10/1982 | Taketoshi et al. . |
| 4,365,587 | 12/1982 | Hirose et al. . |
| 4,366,208 | 12/1982 | Akai et al. . |
| 4,410,758 | 10/1983 | Grolitzer . |
| 4,504,518 | 3/1985 | Ovshinsky et al. . |
| 4,532,199 | 7/1985 | Ueno et al. . |
| 4,535,000 | 8/1985 | Gordon . |
| 4,557,943 | 12/1985 | Rosler et al. . |
| 4,657,774 | 4/1987 | Satou et al. . |
| 4,678,679 | 7/1987 | Ovshinsky . |
| 4,689,093 | 8/1987 | Ishihara et al. . |
| 4,702,934 | 10/1987 | Ishihara et al. . |
| 4,716,048 | 12/1987 | Ishihara et al. . |
| 4,717,584 | 1/1988 | Aoki et al. . |
| 4,717,585 | 1/1988 | Ishihara et al. . |
| 4,717,586 | 1/1988 | Ishihara et al. . |
| 4,718,976 | 1/1988 | Fujimura . |
| 4,726,963 | 2/1988 | Ishihara et al. . |
| 4,728,528 | 3/1988 | Ishihara et al. . |

(List continued on next page.)

FOREIGN PATENT DOCUMENTS

| | | |
|---|---|---|
| 0254654 | 1/1988 | European Pat. Off. . |
| 0359264 | 3/1990 | European Pat. Off. . |

(List continued on next page.)

OTHER PUBLICATIONS

Rie, K., *Deposition of Titanium Nitride Layers Using Plasma CVD\**, 2326 Härterei Mitteilungen (HTM) 42 (1987) May/Jun., No. 3, Munich, Germany, pp. 1–15. Translation.

Hideo Mito, "Thin Film Manufacturing Apparatus" Japanese Abctracts No. JP61–4177693, vol. 10, No. 199, Jul. 1986.

(List continued on next page.)

*Primary Examiner*—Charles L. Bowers, Jr.
*Assistant Examiner*—Vanessa Acosta
*Attorney, Agent, or Firm*—Wood, Herron & Evans, LLP

[57] ABSTRACT

Using plasma enhanced chemical vapor deposition, various layers can be deposited on semiconductor substrates at low temperatures in the same reactor. When a titanium nitride film is required, a titanium film can be initially deposited using a plasma enhanced chemical vapor deposition wherein the plasma is created within 25 mm of the substrate surface, supplying a uniform plasma across the surface. The deposited film can be subjected to an ammonia anneal, again using a plasma of ammonia created within 25 mm of the substrate surface, followed by the plasma enhanced chemical vapor deposition of titanium nitride by creating a plasma of titanium tetrachloride and ammonia within 25 mm of the substrate surface. This permits deposition film and annealing at relatively low temperatures—less than 800° C. When titanium is so deposited over a silicon surface, titanium silicide will form at the juncture which then can be nitrided and coated with titanium or titanium nitride using the plasma enhanced chemical vapor deposition of the present invention. Thus, the present method permits the formation of multiple layers of titanium, titanium nitride, titanium silicide over the surface of the substrate in the same reactor.

15 Claims, 1 Drawing Sheet

U.S. PATENT DOCUMENTS

| | | |
|---|---|---|
| 4,749,589 | 6/1988 | Heinecke et al. ............... 427/39 |
| 4,759,947 | 7/1988 | Ishihara et al. . |
| 4,772,486 | 9/1988 | Ishihara et al. . |
| 4,774,195 | 9/1988 | Beneking . |
| 4,778,692 | 10/1988 | Ishihara et al. . |
| 4,784,874 | 11/1988 | Ishihara et al. . |
| 4,792,378 | 12/1988 | Rose et al. ............... 156/643.1 |
| 4,798,165 | 1/1989 | deBoer et al. ............... 118/725 |
| 4,801,468 | 1/1989 | Ishihara et al. . |
| 4,803,093 | 2/1989 | Ishihara et al. . |
| 4,818,560 | 4/1989 | Ishihara et al. . |
| 4,818,563 | 4/1989 | Ishihara et al. . |
| 4,835,005 | 5/1989 | Hirooka et al. . |
| 4,844,950 | 7/1989 | Saitoh et al. . |
| 4,851,302 | 7/1989 | Nakagawa et al. . |
| 4,853,251 | 8/1989 | Ishihara et al. . |
| 4,869,923 | 9/1989 | Yamazaki . |
| 4,869,924 | 9/1989 | Ito . |
| 4,870,030 | 9/1989 | Markunas et al. . |
| 4,876,983 | 10/1989 | Fukuda et al. . |
| 4,885,067 | 12/1989 | Doty . |
| 4,886,683 | 12/1989 | Hoke et al. . |
| 4,888,062 | 12/1989 | Nakagawa et al. . |
| 4,888,088 | 12/1989 | Slomowitz . |
| 4,897,709 | 1/1990 | Yokoyama et al. . |
| 4,898,118 | 2/1990 | Murakami et al. . |
| 4,900,694 | 2/1990 | Nakagawa . |
| 4,908,329 | 3/1990 | Kanai et al. . |
| 4,908,330 | 3/1990 | Arai et al. . |
| 4,913,929 | 4/1990 | Moslehi et al. . |
| 4,914,052 | 4/1990 | Kanai . |
| 4,926,229 | 5/1990 | Nakagawa et al. . |
| 4,927,786 | 5/1990 | Nishida . |
| 4,937,094 | 6/1990 | Doehler et al. . |
| 4,946,514 | 8/1990 | Nakagawa et al. . |
| 4,951,602 | 8/1990 | Kanai . |
| 4,954,397 | 9/1990 | Amada et al. . |
| 4,957,772 | 9/1990 | Saitoh et al. . |
| 4,959,106 | 9/1990 | Nakagawa et al. . |
| 4,971,832 | 11/1990 | Arai et al. . |
| 4,977,106 | 12/1990 | Smith . |
| 4,987,856 | 1/1991 | Hey et al. . |
| 4,992,305 | 2/1991 | Erbil . |
| 4,992,839 | 2/1991 | Shirai . |
| 4,998,503 | 3/1991 | Murakami et al. . |
| 5,000,113 | 3/1991 | Wang et al. . |
| 5,002,617 | 3/1991 | Kanai et al. . |
| 5,002,618 | 3/1991 | Kanai et al. . |
| 5,002,793 | 3/1991 | Arai . |
| 5,002,796 | 3/1991 | Nishida . |
| 5,006,180 | 4/1991 | Kanai et al. . |
| 5,007,971 | 4/1991 | Kanai et al. . |
| 5,008,726 | 4/1991 | Nakagawa et al. . |
| 5,010,842 | 4/1991 | Oda et al. . |
| 5,018,479 | 5/1991 | Markunas et al. . |
| 5,024,706 | 6/1991 | Kanai et al. . |
| 5,028,488 | 7/1991 | Nakagaa et al. . |
| 5,030,475 | 7/1991 | Ackermann et al. . |
| 5,037,666 | 8/1991 | Mori . |
| 5,039,354 | 8/1991 | Nakagawa et al. . |
| 5,052,339 | 10/1991 | Vakerlis et al. . |
| 5,061,511 | 10/1991 | Saitoh et al. . |
| 5,073,232 | 12/1991 | Ohmi et al. . |
| 5,085,885 | 2/1992 | Foley et al. . |
| 5,087,542 | 2/1992 | Yamazaki et al. . |
| 5,093,149 | 3/1992 | Doehler et al. . |
| 5,093,150 | 3/1992 | Someno et al. . |
| 5,099,790 | 3/1992 | Kawakami . |
| 5,100,495 | 3/1992 | Ohmi et al. . |
| 5,122,431 | 6/1992 | Kodama et al. . |
| 5,126,169 | 6/1992 | Ishihara et al. . |
| 5,130,170 | 7/1992 | Kanai et al. . |
| 5,139,825 | 8/1992 | Gordon et al. . |
| 5,154,135 | 10/1992 | Ishihara . |
| 5,173,327 | 12/1992 | Sandhu et al. . |
| 5,175,017 | 12/1992 | Kobayashi et al. . |
| 5,178,904 | 1/1993 | Ishihara et al. . |
| 5,178,905 | 1/1993 | Kanai et al. . |
| 5,180,435 | 1/1993 | Markunas et al. . |
| 5,192,370 | 3/1993 | Oda ............... 118/723 |
| 5,213,997 | 5/1993 | Ishihara et al. . |
| 5,220,181 | 6/1993 | Kanai et al. . |
| 5,246,881 | 9/1993 | Sandhu et al. . |
| 5,260,236 | 11/1993 | Petro et al. . |
| 5,268,034 | 12/1993 | Vukelic ............... 118/725 |
| 5,273,588 | 12/1993 | Foster . |
| 5,279,857 | 1/1994 | Eichman et al. . |
| 5,296,404 | 3/1994 | Akahori et al. ............... 437/173 |
| 5,308,655 | 5/1994 | Eichman et al. . |
| 5,318,654 | 6/1994 | Maruyama ............... 156/345 |
| 5,342,471 | 8/1994 | Fukasawa . |
| 5,342,652 | 8/1994 | Foster et al. . |
| 5,356,476 | 10/1994 | Foster et al. ............... 118/720 |
| 5,370,739 | 12/1994 | Foster et al. . |
| 5,378,501 | 1/1995 | Foster et al. ............... 427/255.2 |
| 5,396,404 | 3/1995 | Akahori et al. . |
| 5,416,045 | 5/1995 | Kauffman et al. ............... 437/174 |
| 5,433,787 | 7/1995 | Suzuki et al. ............... 118/723 ME |
| 5,434,110 | 7/1995 | Foster et al. ............... 437/245 |
| 5,443,647 | 8/1995 | Aucoin ............... 118/723 ME |
| 5,453,124 | 9/1995 | Moslehi . |

FOREIGN PATENT DOCUMENTS

| | | |
|---|---|---|
| 53-91664 | 8/1978 | Japan . |
| 60-116126 | 6/1985 | Japan ............... 118/728 |
| 60-98629 | 6/1985 | Japan ............... 156/345 |
| 60-204880 | 10/1985 | Japan . |
| 61-41763 | 2/1986 | Japan . |
| 63-187619 | 8/1988 | Japan ............... 118/723 |
| 63-229814 | 9/1988 | Japan . |
| 2310918 | 12/1990 | Japan . |
| 3-80537 | 4/1991 | Japan . |
| 3135018 | 6/1991 | Japan . |
| 4100221 | 4/1992 | Japan . |
| 567596 | 3/1993 | Japan . |
| 2181458 | 4/1987 | United Kingdom . |
| 2192196 | 1/1988 | United Kingdom . |
| 2245600 | 1/1992 | United Kingdom . |
| WO90/04044 | 4/1990 | WIPO . |
| WO93/25722 | 12/1993 | WIPO . |

OTHER PUBLICATIONS

Hilton et al., "Comp. Morph&Mech Prop of Plasma–Asst Chemically Vapor–Dep TiN Films on M2 Tool Steel" Metallurgical and Protective Coatings, Thin Solid Films 139(1986)247–260.

Suzuki et al., "Planarized Deposition of High–Quality Silicon Dioxide Film by Photoassisted Plasma CVD at 300 C Using Tetraethyl Orthosilicate" 362 Jap Jrnl of Applied Physics 29(1990)Dec.#12,Tokyo,JP.

Sun et al., "Formation of TiN and $SiO_2$ by Rapid Processing Using a Large Area Electron Beam" Journal of Vacuum Science & Technology.

Pawlak & Zyrnicki, "Spectroscopic Investigations into Plasma Used for Nitriding Processes of Steel and Titanium", Thin Solid Films, 230.

Hirano Makoto, "Surface Treatment of Ornamental Parts" Abstracts of Japan, JP62151951, vol. 12, No. 5, 1988.

Kodama Atsushi; others, "Thin FIlm Forming Device" Abstracts of Japan, JP2217475, vol. 14, No. 522, 1990.

Kato Isamu, "Formation of Amorphous Silicon Film" Abstracts of Japan, JP2085368, vol. 14, No. 280, 1990.

Kondo Hidekazu; others, "Method and Device for Forming Metallic Wiring" Abstracts of Japan, JP6158320, vol. 18, No. 490, 1994.

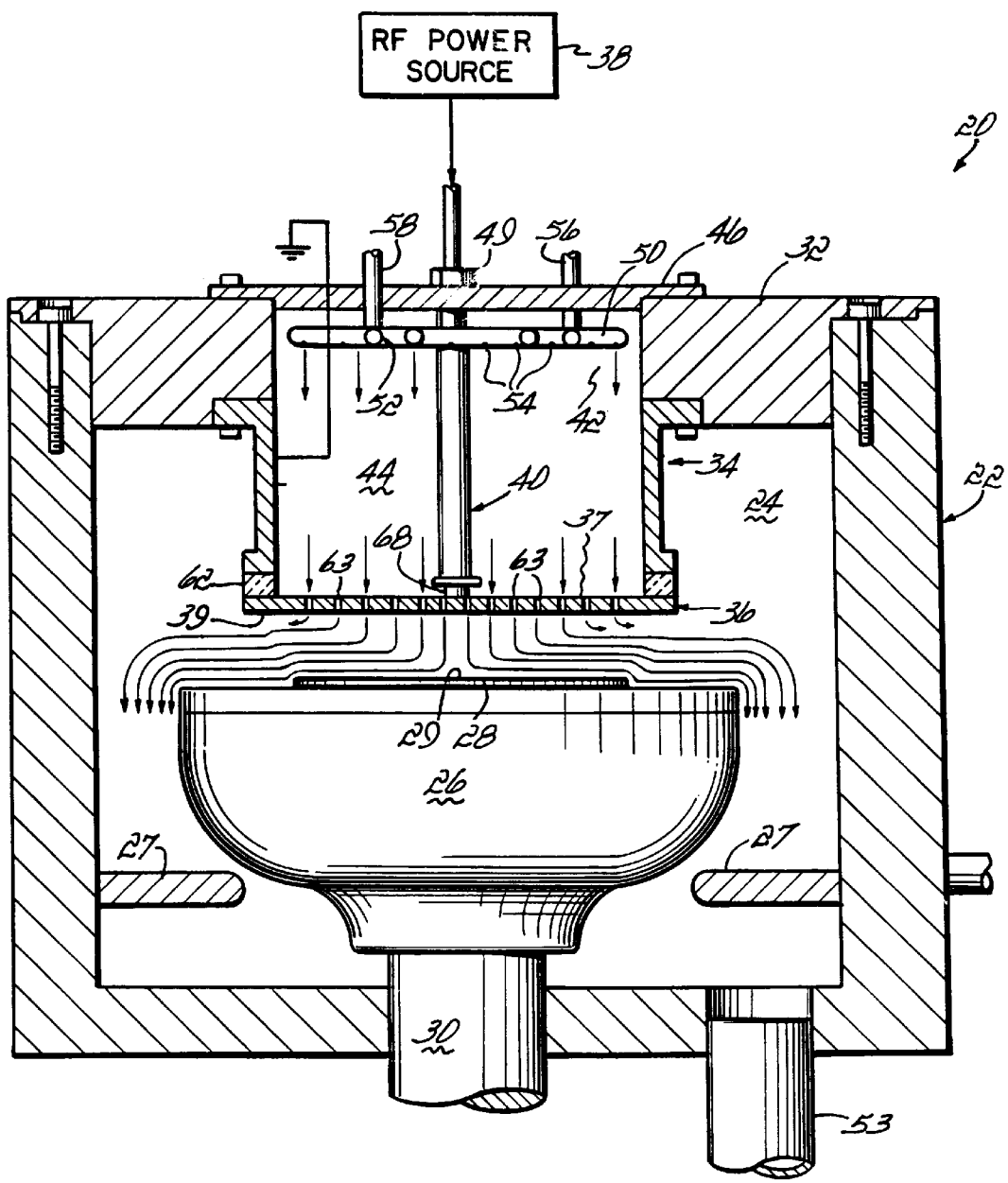

LOW TEMPERATURE PLASMA-ENHANCED FORMATION OF INTEGRATED CIRCUITS

FIELD OF THE INVENTION

This invention relates generally to plasma-enhanced chemical vapor deposition (PECVD) for applying various film coatings to substrates, and more specifically to PECVD conducted at a low effective deposition temperature.

BACKGROUND OF THE INVENTION

In the formation of integrated circuits (IC's), thin films containing metal elements are often deposited upon the surface of a substrate, such as a semiconductor wafer. Thin films are deposited to provide conducting and ohmic contacts in the circuits and between the various devices of an IC. For example, a desired thin film might be applied to the exposed surface of a contact or via hole on a semiconductor wafer, with the film passing through the insulative layers on the wafer to provide plugs of conductive material for the purpose of making interconnections across the insulating layers.

One well known process for depositing thin metal films is chemical vapor deposition (CVD) in which a thin film is deposited using chemical reactions between various deposition or reactant gases at the surface of the substrate. In CVD, reactant gases are pumped into proximity with a substrate inside a reaction chamber, and the gases subsequently react at the substrate surface resulting in one or more reaction by-products which form a film on the substrate surface. Any by-products remaining after the deposition are removed from the chamber. While CVD is a useful technique for depositing films, many of the traditional CVD processes are basically thermal processes and require temperatures in excess of 1000° C. in order to obtain the necessary reactions. Such a deposition temperature is often far too high to be practically useful in IC fabrication due to the effects that high temperatures have on various other aspects and layers of the electrical devices making up the IC.

Certain aspects of IC components are degraded by exposure to the high temperatures normally related to traditional thermal CVD processes. For example, at the device level of an IC, there are shallow diffusions of semiconductor dopants which form the junctions of the electrical devices within the IC. The dopants are often initially diffused using heat during a diffusion step, and therefore, the dopants will continue to diffuse when the IC is subjected to a high temperature during CVD. Such further diffusion is undesirable because it causes the junction of the device to shift, and thus alters the resulting electrical characteristics of the IC. Therefore, for certain IC devices, exposing the substrate to processing temperatures of greater than 800° C. is avoided, and the upper temperature limit may be as low as 650° C. for other more temperature sensitive devices.

Furthermore, such temperature limitations may become even more severe if thermal CVD is performed after metal interconnection or wiring has been applied to the IC. For example, many IC's utilize aluminum as an interconnection metal. However, various undesirable voids and extrusions occur in aluminum when it is subjected to high processing temperatures. Therefore, once interconnecting aluminum has been deposited onto an IC, the maximum temperature to which it can be exposed is approximately 500° C., and the preferred upper temperature limit is 400° C. Therefore, as may be appreciated, it is desirable during CVD processes to maintain low deposition temperatures whenever possible.

Consequently, the upper temperature limit to which a substrate must be exposed precludes the use of some traditional thermal CVD processes which might otherwise be very useful in fabricating IC's. Titanium and titanium nitride are used in a variety of IC applications. It is frequently desired to form a titanium silicide contact layer over a silicon surface. This can be formed using chemical vapor deposition of titanium onto the silicon surface. The titanium silicide forms as the titanium is deposited. Further, in many applications a titanium nitride barrier layer is required prior to deposition of certain metal conductors such as aluminum or tungsten. Titanium nitride can be deposited by chemical vapor deposition. The byproducts of the chemical vapor deposition—in particular, hydrogen chloride—act to etch the titanium contact layer. Therefore, the titanium must be nitrided prior to titanium nitride chemical vapor deposition.

Titanium nitride is frequently deposited onto aluminum as a contact layer. However, when titanium nitride is deposited onto aluminum, aluminum nitride is formed at the interface which acts as an insulator and impedes flow of current from one metalization layer to another. The titanium nitride is needed as an adhesion layer performing tungsten via plugs. To avoid this problem, a titanium layer is required to protect the aluminum and then permit sputter deposition of the titanium nitride adhesion layer.

To sputter deposit a film, the target is electrically biased and ions from the plasma are attracted to the target to bombard the target and dislodge target material particles. The particles then deposit themselves cumulatively as a film upon the substrate. Titanium may be sputtered, for example, over a silicon substrate after various contacts or via openings are cut into a level of the substrate. The substrate might then be heated to about 800° C. to allow the silicon and titanium to alloy and form a layer of titanium silicide ($TiSi_2$). After the deposition of the titanium layer, the excess titanium is etched away from the top surface of the substrate leaving $TiSi_2$ at the bottom of each contact or via. A metal interconnection is then deposited directly over the $TiSi_2$.

While physical sputtering provides deposition of a titanium film at a lower temperature, sputtering processes have various drawbacks. Sputtering normally yields very poor step coverage. Step coverage is defined as the ratio of film thickness on the bottom of a contact on a substrate wafer to the film thickness on the sides of the contact or the top surface of the substrate. Consequently, to sputter deposit a predetermined amount of titanium at the bottom of a contact or via, a larger amount of the sputtered titanium must be deposited on the top surface of the substrate or the sides of the contact. For example, in order to deposit a 200 Å film at the bottom of a contact using sputtering, a 600 Å to 1 Å film layer may have to be deposited onto the top surface of the substrate or the sides of the contact. Since the excess titanium has to be etched away, sputtering is wasteful and costly when depositing layers containing titanium.

Furthermore, the step coverage of the contact with sputtering techniques decreases as the aspect ratio of the contact or via increases. The aspect ratio of a contact is defined as the ratio of contact depth to the width of the contact. Therefore, a thicker sputtered film must be deposited on the top or sides of a contact that is narrow and deep (high aspect ratio) in order to obtain a particular film thickness at the bottom of the contact than would be necessary with a shallow and wide contact (low aspect ratio). In other words, for smaller device dimensions in an IC, corresponding to high aspect ratio contacts and vias, sputtering is even more inefficient and wasteful. The decreased step coverage during sputter deposition over smaller devices results in an increased amount of titanium that must be deposited, thus increasing the amount of titanium applied and etched away, increasing the titanium deposition time, and increasing the etching time that is necessary to remove excess titanium. Accordingly, as IC device geometries continue to shrink and aspect ratios increase, deposition of titanium-containing layers by sputtering becomes very costly.

Further, sputter deposition requires the utilization of a separate reaction chamber. In applications where a first film is deposited by chemical vapor deposition, which is the preferred method, followed by sputter deposition of a second film, two different chambers are required. This could then be followed by a third chamber where, for example, a metal layer would be sputter deposited. It is certainly preferable to minimize the transport of the substrate from one reaction chamber to another and to conduct as many reactions as possible in a single chamber.

One approach which has been utilized in CVD processes to lower the reaction temperature is to ionize one or more of the reactant gases. Such a technique is generally referred to as plasma enhanced chemical vapor deposition (PECVD). However PECVD has not proven to be an efficient method for CVD.

SUMMARY OF THE INVENTION

Accordingly, it is an object of the present invention to provide a method of chemical vapor deposition of films at low temperatures, generally less than 500° C. Further, it is an object of the present invention to provide for the chemical vapor deposition of different films in the same apparatus. These films would include titanium, tungsten and/or titanium nitride. Further, it is an object of the present invention to provide for a method of depositing these films onto a variety of substrates such as silicon, aluminum and tungsten while, at the same time, avoiding many of the problems typically associated with multiple-layer deposition such as creation of shorts and/or production of undesirable high-resistance films.

The objects and advantages of the present invention are provided by plasma-enhanced chemical vapor deposition of films onto substrates wherein the plasma is created in close proximity to the substrate surface. By creating the plasma within about 10 centimeters of the surface of the substrate, the plasma acts to very efficiently coat the substrate surface with the desired thin film.

More particularly, employing a showerhead RF electrode to create the plasma within 25 mm of the substrate surface permits an even plasma at a relatively low temperature permitting a wide variety of different combinations of films to be deposited upon a substrate. Further, incorporating a plasma-enhanced ammonia anneal provides further flexibility in depositing a variety of different films. This will permit PECVD deposition of titanium onto a silicon surface to form titanium suicide which can be annealed with an ammonia plasma. This can be followed by PECVD of a titanium nitride layer, all in the same reactor.

Further, one can use the PECVD method to deposit titanium over an aluminum substrate followed by nitridization with an ammonia plasma anneal. This can thus be coated with titanium nitride using the PECVD method of the present invention.

As can be seen, this provides a method to provide multiple coatings on a substrate in one reaction chamber.

The objects and advantages of the present invention will be further appreciated in light of the following detailed descriptions and drawings in which:

BRIEF DESCRIPTION OF THE DRAWINGS

The FIGURE is a side view in partial cross-section of a deposition chamber for use in the present invention. Modification of this apparatus is disclosed in a U.S. Patent Application entitled "Method and Apparatus for Efficient Use of Reactant Gases and Plasmas for Depositing CVD and PECVD Film" listing Joseph Hillman, Robert Foster and Rikhit Arora as inventors, filed on even date herewith, the Disclosure of which is incorporated herein by reference.

DETAILED DESCRIPTION OF THE INVENTION

The FIGURE shows one embodiment of a CVD reactor for use in the present invention. A similar structure is disclosed in pending U.S. patent application Ser. No. 08/166,745 the disclosure of which is fully incorporated herein by reference. Reactor 20 includes a deposition chamber housing 22 which defines a reaction or deposition space 24. Reactor 20, and specifically reaction space 24 within housing 22, may be selectively evacuated to various different internal pressures, for example, from 0.5 to 10 Torr. The susceptor 26 is coupled to a variable speed motor (not shown) by shaft 30 such that the susceptor 26 and substrate 28 may be rotated at various speeds such as between 0 and 2,000 rpm. Susceptor 26 is also heated by a heating element (not shown) coupled to the susceptor 26 in order that susceptor 26 may heat substrate 28, such as between 200 and 800° C.

Extending downwardly from a top wall 32 of housing 22 is a cylinder assembly 34 which is attached to a gas-dispersing showerhead 36. Showerhead 36 is suspended above substrate 28 by assembly 34. The cylinder assembly 34, in combination with an opening 42 formed in the top housing wall 32, forms a generally vertical flow passage 44 which extends between a housing cover 46 and showerhead 36. Showerhead 36 is coupled to an RF power source 38 by an appropriate RF feedline assembly 40 which extends through cover 46. A sealing structure 49 seals the opening around feedline assembly 40. Feedline 40 can include a heat pipe (not shown) to dissipate unwanted heat.

Plasma and reactant gases are introduced into flow passage 44 by concentric gas rings 50, 52. The concentric rings 50, 52 include a number of holes 54 which evenly dispense the gases around the flow passage 44. Ring 50 is connected to a gas supply through line 56, while ring 52 is connected to a supply by line 58.

An insulator ring 62 separates cylinder 34 and showerhead 36 for reasons discussed hereinbelow. If cylinder 34 is quartz, insulator ring 62 is not needed. In one embodiment of the reactor 20, cylinder 34 is electrically grounded by ground line 61.

The insulator ring 62 preferably has an outer diameter approximately the same as the outer diameter of showerhead 36. Insulator ring 62 ensures complete separation of cylinder 34 and showerhead 36. The insulator ring is preferably made of quartz material approximately 0.75 inches thick.

Showerhead 36 is generally circular and includes dispersion holes 62 generally throughout its entire area. The diameter of the showerhead 36 will depend upon the size of the wafers with which it is used. The showerhead 36 contains generally from 200 to 1,200 holes 62 and preferably from 300 to 600 holes for dispersing the gases. Preferably, the showerhead dispersion holes 62 are sized to prevent creation of a plasma in holes 62. Holes approximately 0.1–1 mm are suitable for this purpose. A suitable showerhead is one which is 0.64 cm thick with 600 0.8 mm holes with a diameter of 17.3 cm.

Showerhead 36 is bolted or screwed to the quartz ring 62. The showerhead 36 includes a stem 68. Stem 68 is formed integrally with the showerhead 36 and form part of the RF line assembly 40 which connects to showerhead 36. The showerhead, 36, including stem 68, is formed of an electrically conductive material preferably Nickel-200. As may be appreciated other conductive materials may also be appropriate. As shown, the showerhead 36 is totally insulated from cylinder 34.

CVD reactant gases are introduced into the top of flow passage 44 by concentric gas rings 50, 52. The gases flow downwardly through flow passage 44 and a velocity profile develops along the length of the flow passage. That is, the gas flow will develop different velocities as measured across the width of flow passage 44. Generally, the velocity of the gas flow at the top of the flow passage near rings 50, 52 is generally equal horizontally across flow passage 44. However, when the gas flow reaches the top surface 37 of showerhead 36, the velocity of the gas flow is greater in the center of the flow passage 44 proximate stem 68 than it is at the sides of the flow passage 44 near the walls of cylinder 34. At the bottom of flow passage 44 generally above showerhead 36, the velocity profile of the gas flow has reached a steady state. When the reactant gases pass through the openings 63 of the showerhead 36, the velocity profile across the bottom surface 39 of the showerhead has flattened out such that the flow velocity proximate the center of showerhead 36 is generally equal to the flow velocity at the peripheral edge of the showerhead.

The reduced spacing between showerhead 36 and rotating substrate 28 produced by the present invention yields uniform gas flow over the top surface 29 of substrate 28 and a very thin boundary layer.

The showerhead 36 is biased with RF energy to function as an RF electrode for PECVD techniques. The close spacing of the RF electrode and the resulting concentrated plasma is very useful for low temperature PECVD, and particularly for low temperature PECVD of titanium-containing films.

The RF power source, through RF feedline assembly 40 biases the showerhead 36 so that the showerhead functions as an RF electrode. The grounded susceptor 26 forms another parallel electrode. An RF field is created preferably between showerhead 36 and susceptor 26. Hereinafter in the application, showerhead 36 will be referred to as showerhead/electrode 36 when referring to a biased showerhead 36 in accordance with the principles of the present invention. The RF field created by the biased showerhead/electrode 36 excites the plasma gases which are dispensed through holes 63 so that a plasma is created immediately below showerhead/electrode 36. It is preferable that the plasma is created below the showerhead/electrode 36 and not within the flow space 44 above the showerhead/electrode. As mentioned above, the dispersion holes 63 are preferably dimensioned so that the plasma is confined below the showerhead/electrode 36. Furthermore, other steps are taken to ensure that the plasma is concentrated below the showerhead/electrode 36. For example, insulator sleeves are utilized within the RF feedline assembly 40 to insulate the RF line from the metal of cylinder 34 and housing 22. Additionally, quartz insulator ring 62 separates the showerhead/electrode 36 from cylinder 34 and further ensures generation of the plasma below the bottom through surface 39 of the showerhead/electrode 36. The rotation of susceptor 26 ensures a uniform flow of plasma gas to the plasma for a uniform deposition.

The reactant gases, such as $TiCl_4$ are introduced through rings 50 and 52. The gas flow from rings 50 and 52 develops within the length of the flow space 44 as the gas travels to the showerhead/electrode 36. The gas particles of the reactant gas are excited by the RF field generated by showerhead/electrode 36 and susceptor 26. Therefore, a gas mixture of excited reactant gas particles and radicals and ions of the plasma gases are concentrated above substrate 28 and close to the substrate. In accordance with the principles of the present invention, the cylinder assembly 34 is dimensioned such that the spacing between showerhead/electrode 36 and substrate 28 is preferably under 25 mm, and more preferably approximately 20 millimeters. As mentioned above, the pressure drop across the showerhead/electrode 36 flattens out the velocity profile of the plasma and reactant gases as they pass through the dispersion holes 63. This produces a generally equal velocity profile across the gas mixture above substrate 28 and promotes a uniform deposition of a film on substrate surface 29.

The frequency range of the showerhead/electrode 36 can be between, for example, 450 KHz and 13.56 MHz. However, the invention does not seem to be particularly frequency sensitive. The unique use of the showerhead/electrode 36 in close proximity to substrate 28 produces a concentrated plasma with a large density of useful gas radicals and ions proximate the substrate surface 29. With the RF showerhead/electrode configuration of the present invention, it has been discovered that there does not seem to be a noticeable enhancement gained in rotating the susceptor 26 faster than approximately 100 rpm, although rotation rates of up to 2,000 rpm or faster are possible. It was also found, however, that a rotation rate of 0 rpm, although not drastically affecting the deposition rate, lowers the uniformity of the reactant and plasma gas flow and the subsequent deposition.

Since the showerhead/electrode 36 of the present invention generates a plasma containing radicals and ions for a plasma-enhanced CVD, the showerhead spacing and deposition parameters must be chosen to achieve a useful mixture of radicals and ions at the substrate surface 29. While some ion bombardment of the substrate 28 is beneficial because it supplies additional energy to the growing film layer on the surface 29, too much ion bombardment of substrate 28 may damage the integrated circuit devices on the substrate. Furthermore, a high density of ions leads to poor film conformality as ions have a tendency to stick to contact and via surfaces.

Finally, waste gases are removed from reaction space 44 through port 53. Baffling 27 may be provided to even the gas flow around the susceptor 26.

This reaction 20 is useful in plasma-enhanced chemical vapor deposition of titanium, tungsten, titanium nitride, titanium silicide, and is useful for the annealing of a previously-deposited titanium film to form titanium nitride. The underlying invention, in turn, relies on the combination of these processes.

The underlying substrate can be any typical IC substrate including silicon, TEOS (tetra ethyl ortho silicate), or quartz, as well as such substrates coated or partially coated with metal conductors, contacts, insulating layers and the like.

To deposit a titanium film according to the present invention, titanium tetrahalide such as titanium tetrachloride is added with hydrogen and is injected through injector rings 50 and 52. In this reaction, the flow rate of titanium tetrachloride should be about 2 to about 100 sccm (generally about 5 sccm) with a significant molar excess of hydrogen gas. Generally, the hydrogen gas flow rate will be 10 to about 300 times that of the flow rate of titanium tetrachloride. Argon can also be used and the hydrogen gas partially released accordingly. The gas inlet temperature for these combined gases is established at about 400° C. to about 800° C. with the substrate heated to a temperature of about 375° C. to about 850° C. The pressure of the reaction chamber can vary from 0.1 to about 20 torr, generally 0.5 to 10 torr. At higher pressures a plasma will not form.

The RF electrode is operated at between about 100 watts up to, as a maximum power, the power at which the devices are damaged, which would be about 5 kilowatts. However, for practical purposes, about 250 watts is sufficient. The frequency of the RF electrode is set at from about 33 MHz down to about 55 KHz, with about 13.56 MHz being acceptable. This frequency is a frequency established by the Federal Communication Commission and therefore most equipment is set up for this frequency. However, it is certainly not determined for the optimization of the present reaction.

Thus, the combined gases are injected into cylinder 34, pass through RF electrode/showerhead 36. A plasma is created and the titanium is formed and deposits onto the substrate 28. The hydrogen reacts with the halide, i.e., chloride, to form hydrogen chloride which is exhausted. The reaction is continued and the titanium film is deposited until a desired thickness of film is applied. Depending upon the particular application, this can vary from about 100 angstroms to about 20,000 angstroms, solely dependant upon the desired application.

If tungsten is desired, the reactant gases are a tungsten halide such as tungsten hexafluoride and hydrogen gas. The tungsten hexafluoride is added through lines 50 and 52 at a flow rate of 2 to about 100 sccm (preferably about 5 sccm) with, again a substantial molar excess of hydrogen gas. Argon is also added, as necessary to maintain pressure. The susceptor temperature will range from about 375° C. to about 850° C.

Again, the RF electrode should be established at about the same frequency and wattage as that set forth for the deposition of titanium. A plasma is thus created forward of showerhead/electrode 36 and tungsten is formed and deposited on rotating substrate 28. The tungsten film can be deposited to any desired thickness and the waste gas will be a combination of unreacted hydrogen and hydrogen fluoride.

For the formation of titanium silicide, a titanium halide gas, preferably titanium tetrachloride, is reacted with silane to form titanium silicide and hydrogen chloride. The reactant gases are injected through rings 50 and 52 into cylinder 34 and through showerhead/electrode 36. The electrode at 13.56 MHz will form a plasma from the reactant gases. The plasma will contact the substrate 28, thus forming titanium silicide on the surface 29 of substrate 28. The preferred reaction conditions for this reaction are:

| | |
|---|---|
| TiCl$_4$ Flow Rate: | 2 to 100 sccm |
| Silane Flow Rate: | 2 to 100 sccm |
| Inert Gas | As needed to maintain pressure |
| Temperature: | 375° C. to 850° C. |
| Rotation Rate: | 100 |
| Pressure: | 0.5 to 20 torr |

An inert gas such as argon or helium is introduced, as necessary to maintain pressure.

Finally, titanium nitride can be deposited by reacting titanium tetrachloride or other titanium halide with a source of nitrogen such as ammonia gas or a combination of nitrogen and hydrogen to produce titanium nitride and hydrogen chloride as a byproducts. The flow rate of titanium halide should preferably be from about 0.5 to about 20 sccm. The flow rate of nitrogen source gas should be from 1 to 200 sccm, with 1 to 5,000 sccm of hydrogen, argon or helium. In all of these reactions, the electrode power, as well as the frequency, can operate within the same parameters for deposition of Ti and the rotation rate remains about the same.

One final reaction which can be conducted in the apparatus of the present invention and used beneficially in the present invention is the nitridization of a previously-deposited titanium film. In this reaction, where the susceptor is previously coated with a titanium film, the titanium film may require nitridization. This can be conducted by reacting the surface with an ammonia plasma. The flow rate of the nitridization gas can be from about 10 sccm to about 5,000 sccm. Preferably, the frequency will be about 480 KHz. The temperature of the reaction can vary from about 650° C. down to about 300° C. with a preferred temperature being less than 500° C., preferably 400–450° C. The pressure must be subatmospheric in all of these reactions and generally can vary from 500 millitorr up to about 20 torr, with about 1 torr being preferred. In the nitridization reaction, the reaction time can vary from 1 minute to about 10 minutes, with about 5 minutes being preferred. These reactions will be further appreciated in light of the following detailed examples.

EXAMPLE 1

Utilizing the deposition configuration, a layer of titanium nitride was deposited upon a substrate wafer at approximately a temperature of 400° C. Specifically, a layer of titanium nitride was deposited using ammonia gas (NH$_3$) and nitrogen gas (N$_2$) with the parameters listed below and the results shown in Table 1.

TABLE NO. 1

| Deposition Parameters for Table No. 1: | |
|---|---|
| TiCl$_4$ (sccm) | 10 |
| NH$_3$ (sccm) | 500 |
| N$_2$ (sccm) | 500 |
| RF Power (watts) | 250 @ 450 KHz |
| Reaction Chamber Pressure (Torr) | 1 |
| Susceptor Rotation Rate (rpm) | 100 |
| Substrate Temp. (° C.) | 400 |

| RESULTS AND ADDITIONAL DEPOSITION PARAMETERS | | | | | |
|---|---|---|---|---|---|
| Wafer No. | TiN layer thickness (Å) | Deposition Rate (Å/min) | Layer Resistivity ($\mu\Omega$-cm) | Deposition Time (sec) | Susceptor Temp (° C.) |
| 1 | 800 | 400 | 1519 | 120 | 414 |
| 2 | 698 | 348 | 1194 | 120 | 471 |
| 3 | 608 | 304 | 970 | 120 | 457 |
| 4 | 545 | 272 | 940 | 120 | 461 |
| 5 | 723 | 241 | 1021 | 180 | 462 |
| 6 | 910 | 303 | 1284 | 180 | 475 |

Wafers 1–3 were silicon, while wafers 4–6 were thermal oxide wafers having a thin layer of silicon dioxide on the surface. This was done to ensure that the process of the present invention may be utilized in a broad range of CVD applications for both silicon wafers and oxide wafers. Each of the substrate wafers of Table 1 were also given an RF plasma ammonia (NH$_3$) anneal in the reactor 40 at 250 Watts for approximately 120 seconds with a gas flow rate of 5000 sccm of NH$_3$ at a pressure of 5 Torr. The rotation rate of the susceptor during the anneal was approximately 100 rpm. The NH$_3$ RF plasma improves the film quality of the deposited TiN film as discussed further hereinbelow.

The RF plasma electrode/showerhead configuration, in accordance with the principles of the present invention, may be utilized to deposit a titanium nitride (TiN) layer on a substrate utilizing both nitrogen gas ($N_2$) and hydrogen gas ($H_2$) instead of ammonia gas ($NH_3$). The various film results and deposition parameters for the $H_2$ and $N_2$ low temperature deposition of TiN are given below in Table Nos. 2, 3, 4 and 5, at increasing deposition temperatures for increasing table numbers.

TABLE NO. 2

Deposition Parameters for Table No. 2:

| | |
|---|---|
| $TiCl_4$ (sccm) | 10 |
| $H_2$ (sccm) | 500 |
| $N_2$ (sccm) | 500 |
| RF Power (watts) | 250 @ 450 KHz |
| Reaction Chamber Pressure (Torr) | 1 |
| Susceptor Rotation Rate (rpm) | 100 |
| Substrate Temp. (C. °) | 400 |
| Deposition Time | 180 (seconds) |

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 825 | 275 | 1,530 | 470 |
| 2 | 1,023 | 341 | 26,864 | 480 |
| 3 | 1,221 | 407 | 4,118 | 488 |
| 4 | 1,262 | 421 | 3,108 | 470 |
| 5 | 1,227 | 409 | 855 | 470 |
| 6 | 1,224 | 408 | 4,478 | 460 |
| 7 | 1,141 | 380 | 3,982 | 460 |
| 8 | 1,348 | 449 | 4,658 | 460 |
| 9 | 1,400 | 487 | 3,449 | 460 |
| 10 | 1,106 | 389 | 4,501 | 460 |

Wafers 1 and 2 of Table No. 2 were silicon, while the remaining wafers 3–10 were thermal oxide. Wafers 6–10 received a 250 watt RF plasma anneal for 120 seconds at an $NH_3$ gas rate of 5,000 sccm, at internal pressure of 3 torr (wafer 6 was done at 5 torr) and a susceptor rotation rate of 100 rpm.

Table No. 3 illustrates the results of deposition runs utilizing a substrate temperature of 450° C., but maintaining the same gas and deposition parameters as were used in the deposition runs of Table No. 2. Wafer 1 and 2 were silicon while wafers 3–8 were thermal oxide. The results are as follows with wafers 6–8 of Table No. 3 receiving a 120 second RF plasma ammonia anneal at 5000 sccm, 5 Torr and a 100 rpm rotation rate with a power level of 250 Watts.

TABLE NO. 3

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 996 | 332 | 640 | 518 |
| 2 | 1,069 | 336 | 607 | 519 |
| 3 | 1,064 | 355 | 666 | 521 |
| 4 | 1,488 | 496 | 815 | 524 |
| 5 | 1,562 | 521 | 821 | 521 |
| 6 | 1,444 | 481 | 7,121 | 522 |
| 7 | 1,381 | 454 | 5,812 | 524 |
| 8 | 1,306 | 435 | 6,363 | 523 |

The low temperature TiN deposition was repeated with the substrate temperature at 500° C. and the results are tabulated according to Table No. 4 below. Wafer 1 was silicon and wafers 2–7 were thermal oxide.

TABLE NO. 4

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 990 | 330 | 578 | 579 |
| 2 | 1,086 | 362 | 687 | 590 |
| 3 | 1,034 | 345 | 700 | 597 |
| 4 | 1,092 | 364 | 786 | 595 |
| 5 | 1,004 | 335 | 1,892 | 591 |
| 6 | 1,001 | 334 | 1,840 | 593 |
| 7 | 1,004 | 335 | 1,886 | 594 |

Wafers 1–4 in Table No. 4 were not annealed, while wafers 5–7 were annealed using a similar RF plasma $NH_3$ anneal process and the parameters used for the deposition runs referenced in Table No. 3.

Similarly with a substrate temperature of 600° C., the CVD process of the present invention was used to deposit TiN with the results shown in Table No. 5 below, with wafers 1 and 2 being silicon and wafers 3–8 being thermal oxide.

TABLE NO. 5

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 657 | 219 | 391 | 650 |
| 2 | 822 | 274 | 254 | 650 |
| 3 | 740 | 247 | 432 | 650 |
| 4 | 768 | 263 | 543 | 650 |
| 5 | 767 | 256 | 471 | 650 |
| 6 | 765 | 255 | 949 | 650 |
| 7 | 773 | 258 | 973 | 650 |
| 8 | 910 | 303 | 2,710 | 650 |

Again, an RF plasma $NH_3$ anneal was performed on substrate wafers 6–8 of Table No. 5 similar to the anneal step of tables 3 and 4 except at a pressure of 1 Torr instead of 5 Torr. Therefore, the deposition of TiN using the low temperature CVD process of the present invention may be accomplished at various temperatures lower than the temperatures necessary for traditional thermal CVD.

While titanium nitride may be deposited with the present invention, it may also be desirable to deposit simply a layer of pure titanium. For example, a titanium layer might be deposited upon a silicon wafer which then reacts with the titanium to form a film of titanium silicide ($TiSi_2$). To this end, the present invention may also to deposit a layer of titanium.

Table No. 6 below sets forth the results and parameters of a deposition run which resulted in a deposited film of approximately 84% titanium on a thermal oxide wafer at 650° C. This was an excellent result for such low temperature chemical vapor deposition. The deposition run of Table 6 was performed according to the following deposition parameters, with the RF showerhead/electrode configuration of FIG. 2.

TABLE NO. 6

Deposition Parameters for Table No. 6

| | |
|---|---|
| $TiCl_4$ (sccm) | 10 |
| $H_2$ (sccm) | 500 |

TABLE NO. 6-continued

| | |
|---|---|
| RF Power (watts) | 250 @ 450 KHz |
| Reaction Chamber Pressure (Torr) | 1 |
| Susceptor Rotation Rate (rpm) | 100 |
| Deposition time (sec) | 2700 |
| Substrate Temperature (° C.) | 650 |

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 1,983 | 44 | 929 | 651 |

The substrate wafer of Table No. 6 was not annealed.

Additional Ti-layer deposition runs were made according to the Table No. 7 parameters below with the following results shown in Table No. 7:

TABLE NO. 7

Deposition Parameters for Table No. 7

| | |
|---|---|
| TiCl$_4$ (sccm) | 10 |
| H$_2$ (sccm) | 500 |
| RF Power (watts) | 250 @ 450 KHz |
| Reaction Chamber Pressure (Torr) | 0.85 |
| Susceptor Rotation Rate (rpm) | 100 |
| Deposition time (sec) | 120 (wafer 7 for 180 sec) |
| Substrate Temperature (° C.) | 565 |
| Susceptor Temperature (° C.) | 650 |

RESULTS AND ADDITIONAL DEPOSITION PARAMETERS

| Wafer No. | Ti layer thickness (Å) | Deposition Rate (Å/min) | Layer Resistivity ($\mu\Omega$-cm) |
|---|---|---|---|
| 1 | 134.8 | 67.4 | 2,116.1 |
| 2 | 466.2 | 233.1 | 1,767.8 |
| 3 | 209.2 | 104.6 | 761.8 |
| 4 | 100.8 | 50.4 | — |
| 5 | 194.04 | 97.0 | — |
| 6 | 154.98 | 77.5 | — |
| 7 | 115.92 | 38.6 | 1,001.4 |
| 8 | 114.7 | 57.3 | 371.6 |
| 9 | 152.5 | 76.2 | 321.6 |
| 10 | 39.06 | 19.5 | — |
| 11 | 41.6 | 20.6 | — |
| 12 | 50.4 | 25.2 | — |

Since a benefit of chemical vapor deposition of titanium-containing films is improved step coverage and film conformality over the physical deposition techniques, several of the film layers deposited according to the present invention were tested to measure conformality and step coverage. The layers tested for conformality and step coverage were deposited according to the parameters of Table No. 8 with the results shown in Table No. 8 below. The film conformality and step coverage of the film layers deposited according to the parameters below were very good.

Deposition Parameters for Conformality and Step Coverage

TABLE NO. 8

Deposition Runs of Table 8

| | |
|---|---|
| TiCl (sccm) | 10 |
| H$_2$ (sccm) | 500 |
| N$_2$ (sccm) | 500 |
| RF Power (watts) | 250 @ 450 KHz |

TABLE NO. 8-continued

| | |
|---|---|
| Reactor Chamber Pressure (Torr) | 1 |
| Susceptor Rotation rate (rpm) | 100 |
| Substrate Temperature (° C.) | 450 |
| Susceptor Temperature (° C.) | 520 |

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 586 | 362 | — | 520 |
| 2 | 2,423 | 304 | — | 520 |

None of the wafers used in Table 8 and tested for step coverage were annealed with an RF plasma of NH$_3$.

As illustrated above a layer of titanium nitride (TiN) may be deposited in accordance with the principles of the present invention without utilizing ammonia gas (NH$_3$). Instead, a mixture of H$_2$ and N$_2$ gases is used. Low temperature deposition of titanium nitride using TiCl$_4$, N$_2$ and H$_2$ is desirable because it reduces contaminants within the reaction chamber that are formed by the chemical reactions of TiCl$_4$ and NH$_3$. More specifically, TiCl$_4$ reacts with NH$_3$ at temperatures below 120° C. to form a yellow powdery adduct, and to prevent the adduct from forming it was necessary in the past to heat the reaction chamber walls to at least 150° C. Since it is now possible to deposit a layer of titanium nitride at low temperatures using TiCl$_4$, N$_2$, and H$_2$ chemistry instead of NH$_3$, it is no longer necessary to remove a deposited adduct or to heat the reaction chamber walls, thus greatly reducing the cost of CVD systems.

According to the deposition parameters of Table No. 9, a layer of titanium nitride was deposited upon several thermal oxide substrates using a reaction chamber with unheated walls and a gas mixture of H$_2$/N$_2$. After the deposition of the films, the reaction chamber was inspected and there was no evidence of a yellow adduct found. None of the wafers of Table No. 9 were annealed with an RF NH$_3$ anneal.

TABLE NO. 9

Parameters for Adduct Test of Table No. 9

| | |
|---|---|
| TiCl$_4$ (sccm) | 10 |
| N$_2$ (sccm) | 500 |
| H$_2$ (sccm) | 500 |
| RF Power (watts) | 250 @ 450 KHz |
| Reaction Chamber Pressure (Torr) | 1 |
| Susceptor Rotation rate (rpm) | 100 |
| Substrate Temp. (° C.) | 450 |
| Deposition time (sec) | 95 |
| Susceptor Temperature (° C.) | approximately 520 |

RESULTS AND ADDITIONAL DEPOSITION PARAMETERS

| Wafer No. | TiN layer thickness (Å) | Deposition Rate (Å/min) | Layer Resistivity ($\mu\Omega$-cm) | Susceptor Temp (° C.) |
|---|---|---|---|---|
| 1 | 94 | 58 | 2,164 | 525 |
| 2 | 132 | 83 | 2,118 | 523 |
| 3 | 127 | 80 | 1,377 | 520 |
| 4 | 143 | 90 | 660 | 520 |
| 5 | 143 | 90 | 764 | 520 |
| 6 | 160 | 101 | 905 | 523 |
| 7 | 162 | 102 | 738 | 521 |
| 8 | 162 | 102 | 830 | 520 |
| 9 | 195 | 123 | 689 | 519 |
| 10 | 204 | 129 | 702 | 523 |

Further deposition runs were made wherein the plasma and reactant gas flows were adjusted, as well as the internal deposition pressure. For example, the deposition runs shown in Table 10 utilized a higher flow rate of $H_2$ and an increased deposition pressure from 1 Torr to 5 Torr. Further, Argon was mixed with the $H_2$ for some of the deposition runs.

TABLE NO. 10

Parameters for Table 10

| | |
|---|---|
| $TiCl_4$ (sccm) | 10 |
| $H_2$ (sccm) | 2,000 (wafers 1–4); 1,500 (wafers 5–9) |
| Argon (slm) | 0.5 (wafers 5–9) |
| RF Power (watts) | 259 @ 450 KHz |
| Reaction Chamber Pressure (Torr) | 5 |
| Susceptor Rotation rate (rpm) | 100 |
| Substrate Temp. (° C.) | 565 |
| Deposition time (sec) | 300 (600 for wafer 9) |
| Susceptor Temperature (° C.) | approximately 650 |

RESULTS AND ADDITIONAL DEPOSITION PARAMETERS

| Wafer No. | Ti layer thickness (Å) | Deposition Rate (Å/min) | Layer Resistivity ($\mu\Omega$-cm) |
|---|---|---|---|
| 1 | 94 | 58 | 2,164 |
| 2 | 132 | 83 | 2,218 |
| 3 | 127 | 80 | 1,377 |
| 4 | 143 | 90 | 660 |
| 5 | 143 | 90 | 764 |
| 6 | 160 | 101 | 905 |
| 7 | 162 | 102 | 738 |
| 8 | 162 | 102 | 830 |
| 9 | 195 | 123 | 689 |

In Table 10, the flow of $H_2$ was increased to 2,000 sccm for wafers 1–4 and 1,500 sccm for wafers 5–9. The deposition pressure was increased to 5 Torr. For wafers 5–9, a flow of 0.5 standard liters per minute (slm) of Argon was utilized with the $H_2$ as a diluent. In Table 10, wafers 1–2 and 5–6 were silicon, while wafers 3–4 and 7–9 were thermal oxide.

Table 11 shows additional runs made with the increased $H_2$ flow and increased deposition pressure.

TABLE NO. 11

Deposition Parameters for Table No. 11

| | |
|---|---|
| $TiCl_4$ (sccm) | 10 |
| $H_2$ (sccm) | 1,500 |
| Argon (slm) | 0.5 |
| RF Power (watts) | 250 @ 450 KHz |
| Reaction Chamber Pressure (Torr) | 5 |
| Susceptor Rotation Rate (rpm) | 100 |
| Deposition time (sec) | 300 (wafers 9–12 600 sec) |
| Substrate Temperature (° C.) | 565 |
| Susceptor Temperature (° C.) | 650 |

RESULTS AND ADDITIONAL DEPOSITION PARAMETERS

| Wafer No. | Ti layer thickness (Å) | Deposition Rate (Å/min) | Layer Resistivity ($\mu\Omega$-cm) |
|---|---|---|---|
| 1 | | 67.4 | 2,116.1 |
| 2 | | 233.1 | 1,767.8 |
| 3 | 209.2 | 104.6 | 761.8 |
| 4 | | 50.4 | — |
| 5 | 194.04 | 97.0 | — |
| 6 | | 77.5 | — |
| 7 | 15.92 | 38.6 | 1,001.4 |
| 8 | | 57.3 | 371.6 |
| 9 | | 76.2 | 321.6 |
| 10 | | 39.06 | 19.5 | — |
| 11 | | 41.6 | 20.6 | — |
| 12 | | 50.4 | 25.2 | — |

The change in deposition pressure from 1 Torr to 5 Torr produced a more stable and symmetric plasma. Additionally, the increased hydrogen flow with the addition of a small flow of Argon increased the stability of the plasma flow as well as the plasma intensity. An argon flow of 0–10 slm is preferable. Wafers 1–2 were silicon, while wafers 3–10 were thermal oxide. Wafers 11 and 12 were borophospho-silicate glass, available from Thin Films, Inc. of Freemont, Calif. None of the wafers of either Table 10 or 11 were annealed with a $NH_3$ plasma anneal.

Table 12 shows additional deposition runs at a susceptor temperature of 450° C.

TABLE NO. 12

Deposition Parameters for Table No. 12

| | |
|---|---|
| $TiCl_4$ (sccm) | 5 |
| $H_2$ (sccm) | 1,500 |
| Argon (slm) | 0.3 |
| RF Power (watts) | 250 @ 450 KHz |
| Reaction Chamber Pressure (Torr) | 5 |
| Susceptor Rotation Rate (rpm) | 100 |
| Substrate Temperature (° C.) | 450 |
| Susceptor Temperature (° C.) | 450 |

RESULTS AND ADDITIONAL DEPOSITION PARAMETERS

| Wafer No. | Ti layer thickness (Å) | Deposition Rate (Å/min) | Layer Resistivity ($\mu\Omega$-cm) |
|---|---|---|---|
| 1 | 990 | 330 | 578 |
| 2 | 1,086 | 362 | 687 |
| 3 | 1,034 | 345 | 700 |
| 4 | 1,092 | 364 | 786 |
| 5 | 1,004 | 335 | 1,892 |
| 6 | 1,001 | 334 | 1,840 |
| 7 | 1,004 | 335 | 1,886 |

Wafers 1–4 were silicon, wafer 5 was thermal oxide while wafers 6 and 7 were an aluminum alloy containing aluminum silicon and copper. Runs 6 and 7 of Table 12 illustrate the viability of depositing a titanium-containing film on aluminum using the present invention. The deposition runs of Table 12 utilized a lower flow of reactant gas than the runs of Table 11, i.e., 5 sccm of $TiCl_4$.

The deposition runs of Table 13 were made at further reduced $TiCl_4$ flow rates. All of the wafers of Table 13 were thermal oxide. None of the wafers of Table 12 or 13 were annealed with an $NH_3$ RF anneal.

TABLE NO. 13

Deposition Parameters for Table No. 13

| | |
|---|---|
| $TiCl_4$ (sccm) | wafers 1–2, 4 sccm; 3–4, 3 sccm; 5—6, 2 sccm; and wafer 7 at 1 sccm |
| $H_2$ (sccm) | 1,500 |
| RF Power (watts) | 250 @ 450 KHz |
| Reaction Chamber Pressure (Torr) | 5 |
| Susceptor Rotation Rate (rpm) | 100 |

TABLE NO. 13-continued

| | |
|---|---|
| Deposition time (sec) | 300 |
| | (wafers 1 and 2 at 180 and 240, respectively) |
| Substrate Temperature (° C.) | 450 |
| Susceptor Temperature (° C.) | 450 |

RESULTS AND ADDITIONAL DEPOSITION PARAMETERS

| Wafer No. | Ti layer thickness (Å) | Deposition Rate (Å/min) | Layer Resistivity ($\mu\Omega$-cm) | Susceptor Temp (° C.) |
|---|---|---|---|---|
| 1 | 990 | 330 | 578 | 579 |
| 2 | 1,086 | 362 | 678 | 590 |
| 3 | 1,034 | 345 | 700 | 597 |
| 4 | 1,092 | 364 | 786 | 595 |
| 5 | 1,004 | 335 | 1,892 | 591 |
| 6 | 1,001 | 334 | 1,840 | 593 |
| 7 | 1,004 | 335 | 1,886 | 594 |

According to the present invention, multiple layers are deposited onto the substrate. The procedures previously described for deposition of individual layers of tungsten, titanium, titanium nitride, or titanium silicide are employed to deposit a first layer onto the substrate followed by a different second layer. The second layer would also be deposited according to the procedures previously set forth. Optimally, additional layers can be deposited. When advantageous, an ammonia anneal would be used.

An integrated contact metalization process can be used by first depositing titanium onto a silicon surface by PECVD. This will form a layer of titanium silicide. After the titanium deposition an ammonia plasma anneal is performed to provide an upper layer of nitrided silicide titanium. Finally, a titanium nitride layer can be deposited by PECVD, again in the same reaction chamber. Finally, following the deposition of the titanium nitride, aluminum or tungsten metal can be sputter deposited. This final deposition, however, would require a separate chamber using sputter deposition technology. Any sputter deposition chamber typically employed could be used for the present invention. The method of sputter deposition is well known to those skilled in the art and, per se, forms no part of this invention.

The present invention can also be used to form protective layers for aluminum contacts. When titanium nitride is deposited onto aluminum metalization, aluminum nitride is formed at the interface. This is an insulator and therefore impedes the flow of current from one metalization layer to another. The titanium nitride layer is needed as an adhesion layer for forming tungsten via plugs. To overcome this problem, a titanium layer is deposited onto the previously-deposited aluminum layer using the PECVD process previously described. The titanium layer is then subjected to a plasma enhanced ammonia anneal, also as previously discussed. Finally, a thicker layer of titanium nitride can be deposited using the PECVD process of the present invention. Thus, the deposited titanium layer will protect the aluminum layer, preventing formation of aluminum nitride due to reaction with titanium nitride. Again, this can all be done in one reactor where previously two sputtering chambers would have been required. This thus provides for a single chamber CVD multi-level metalization process.

Further, the present invention can be used to apply a titanium nitride film over a titanium film. The titanium film can be deposited over any substrate according to the PECVD method previously described. The titanium is next subjected to a plasma ammonia anneal, as previously discussed, to form an adhesion layer of titanium nitride. Titanium nitride is then deposited by the PECVD method of the present invention. When depositing a titanium nitride film over a nitrided titanium film, it may be preferable to do this in two steps. In an initial step, the titanium can be deposited in titanium tetrachloride depletion, i.e., titanium tetrachloride flow rate of 20 sccm with a flow rate of ammonia of about 500 sccm with 5 liters per minute of nitrogen as a diluent. After a thin layer—about 100 to 500 angstroms—of titanium nitride has been deposited, the flow rate of the titanium tetrachloride can be turned up into the saturation regime, i.e., about 80 sccm, with the ammonia and nitrogen rates remaining constant. This can be deposited to a desired thickness and the conformality should be about 100%.

While the present invention has been illustrated by the description of embodiments thereof, and while the embodiments have been described in considerable detail, the scope of the present invention should not be limited to such detail. Additional advantages and modifications will readily appear to those skilled in the art. For example, the low temperature CVD technique of the present invention may be utilized to deposit other films besides the titanium-containing films discussed in extensive detail herein. Furthermore, activated radicals of gases other than $H_2$ and $N_2$ might also be utilized to lower the deposition temperature. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A method of depositing a titanium nitride film onto a substrate comprising:

in a reaction chamber forming a titanium layer on said surface of a substrate by creating a plasma of a gas mixture, said gas mixture comprising titanium tetrahalide and hydrogen wherein said plasma is created within about 25 mm of said surface;

in said reaction chamber nitriding said titanium layer by forming a plasma from a gas selected from the group consisting of ammonia and nitrogen within 25 mm of said titanium layer, thereby forming said titanium nitride film.

2. The method claimed in claim 1 wherein said substrate surface is aluminum.

3. The method claimed in claim 1 wherein said substrate surface is titanium.

4. The method claimed in claim 1 further comprising in said reactor depositing a layer of titanium nitride on said titanium nitride film by creating a plasma from a second gas mixture, said second gas mixture comprising titanium tetrahalide and a gas selected from the group consisting of nitrogen and ammonia wherein said plasma is created within 25 mm of said first layer of titanium nitride film.

5. The method claimed in claim 4 wherein said substrate surface is aluminum.

6. The method claimed in claim 4 wherein said substrate surface is titanium.

7. A method of forming a titanium/titanium nitride stacked film on a substrate comprising conducting the following reaction steps in a single reaction chamber without removing said substrate from said chamber until all of the reaction steps have been completed, said reaction steps comprising:

evacuating said chamber to a desired pressure;

subjecting said substrate to a plasma formed from titanium tetrahalide and hydrogen to form a titanium layer on said substrate;

subjecting said titanium layer to an ammonium plasma to form a thin film of titanium nitride on said titanium film;

depositing a layer of titanium nitride onto said thin film of titanium nitride by subjecting said thin film to a plasma formed from a gas mixture comprising titanium tetrahalide and a nitrogen-containing gas selected from the group consisting of nitrogen and ammonia.

8. The method claimed in claim 1 wherein said first gas mixture comprises less than about 10% titanium tetrahalide wherein about 100–500 angstroms of titanium nitride is deposited; and wherein the gas mixture is changed to establish a titanium tetrahalide concentration greater than 10% up to about 20%.

9. The method claimed in claim 7 further including the reaction step of subjecting said titanium nitride film to an ammonia anneal in said reaction chamber.

10. The method claimed in claim 7 wherein said substrate is heated to a temperature of 400 to 500° C. and maintained at said temperature throughout all of said reaction steps.

11. A method of forming a titanium nitride film on a silicon surface comprising forming a first plasma of a first gas mixture comprising titanium tetrahalide and hydrogen wherein said first plasma is created within 25 mm of a silicon surface, thereby depositing a titanium film onto said silicon surface;

nitriding said deposited film by creating a second plasma of a second gas wherein said second gas is selected from the group consisting of ammonia and nitrogen and wherein said second plasma of said second gas is created within 25 mm of said deposited film; and depositing a layer of titanium nitride film on said nitrided deposited film by creating a third plasma of a third gas mixture, said third gas mixture comprising titanium tetrahalide and a gas selected from the group consisting of ammonia and nitrogen.

12. The method claimed in claim 11 wherein said titanium tetrahalide is titanium tetrachloride.

13. The method claimed in claim 11 wherein said second gas is ammonia.

14. The method claimed in claim 11 wherein each of said first, second and third plasmas are created within 20 mm of said surface.

15. The method claimed in claim 11 wherein said first, second and third plasma are created by creating a radio frequency potential at a metal showerhead located within 25 mm of said surface.

* * * * *